United States Patent [19]

Yonezawa et al.

[11] Patent Number: 4,587,928

[45] Date of Patent: May 13, 1986

[54] APPARATUS FOR PRODUCING A SEMICONDUCTOR DEVICE

[75] Inventors: Toshio Yonezawa, Yokosuka; Hisashi Muraoka, Yokohama, both of Japan

[73] Assignee: Tokyo Shibaura Electric Co., Ltd., Kawasaki, Japan

[21] Appl. No.: 200,546

[22] Filed: Oct. 24, 1980

Related U.S. Application Data

[63] Continuation of Ser. No. 935,959, Aug. 23, 1978, abandoned, which is a continuation of Ser. No. 753,446, Dec. 22, 1976, abandoned.

[30] Foreign Application Priority Data

Dec. 24, 1975 [JP] Japan ................. 50-153378

[51] Int. Cl.⁴ .............................................. B05C 11/00
[52] U.S. Cl. ................................... 118/500; 118/715
[58] Field of Search ........ 118/500, 715, 719, 728–732; 148/189; 432/258, 259; 211/41

[56] References Cited

U.S. PATENT DOCUMENTS

| | | | |
|---|---|---|---|
| 3,265,528 | 8/1966 | Bond ............................ | 118/715 X |
| 3,424,629 | 1/1969 | Ernst et al. . | |
| 3,436,255 | 4/1969 | Harres et al. . | |
| 3,645,695 | 2/1972 | Koepp et al. . | |
| 3,746,569 | 7/1973 | Pammer et al. . | |
| 3,834,349 | 9/1974 | Dietz et al. .................... | 148/189 X |
| 3,951,587 | 4/1976 | Alliegro et al. ................ | 432/259 X |
| 3,998,333 | 12/1976 | Kamada ......................... | 432/258 X |
| 4,016,313 | 4/1977 | Schrewelius .................. | 432/258 X |

FOREIGN PATENT DOCUMENTS

| | | |
|---|---|---|
| 887037 | 1/1962 | United Kingdom . |
| 970456 | 9/1964 | United Kingdom . |
| 1004257 | 9/1965 | United Kingdom . |
| 1224146 | 3/1971 | United Kingdom . |
| 1306988 | 2/1973 | United Kingdom . |
| 1332348 | 10/1973 | United Kingdom . |
| 1425965 | 2/1976 | United Kingdom . |

*Primary Examiner*—John P. McIntosh
*Attorney, Agent, or Firm*—Finnegan, Henderson, Farabow, Garrett & Dunner

[57] ABSTRACT

A process tube that is impermeable to impurities for use in the manufacture of semiconductor devices. The process tube is made of sintered silicon carbide and it may optionally be infiltrated with elemental silicon. The inner surface of the process tube includes a layer of high density silicon carbide to prevent diffusion of impurity species through the walls of the process tube.

11 Claims, 3 Drawing Figures

APPARATUS FOR PRODUCING A SEMICONDUCTOR DEVICE

This is a continuation of Ser. No. 935,959, filed Aug. 23, 1978, now abandoned, which is a continuation of Ser. No. 753,446, filed Dec. 22, 1976, now abandoned.

This invention relates to an apparatus for producing a semiconductor device.

A number of heating steps are absolutely required for the production of either discrete semiconductor devices including transistor, diode, etc. or IC, LSI, etc. having various circuit elements formed within a semiconductor substrate. For example, selective oxidation, epitaxial growth, impurity diffusion, etc. are carried out at temperatures of about 1000° to 1200° C. In general, an alumina tube designed for effecting uniform heating (hereinafter referred to as uniform-heating tube) is used in these heating steps. For example, a wafer or the like is housed in a quartz tube disposed within such an alumina tube and heated from the outside of the alumina tube. In this case, however, impurities such as sodium ion are diffused from the alumina tube into the quartz tube during the heat treatment, rendering the quartz tube opaque. This presents a serious problem. If such an opaque quartz tube is used for producing a semiconductor device, the impurities like sodium ion are diffused into the silicon dioxide film of the resultant semiconductor device, leading to the deterioration of the properties of the semiconductor device including an increased leak current, an increased 1/f noise generation, etc. This property deterioration problem is considered to come from all the instruments used for producing a semiconductor device such as wafer holders, wafer boats, wafer carriers, tweezers, withdrawing rods, etc. as well as from the uniform-heating tube.

To solve the problem, the inventors have made extensive researches. One of the ideas coming to the inventors was to use silicon carbide for preparing a uniform-heating tube. For example, a silicon carbide powder was sintered and, then, impregnated with silicon for the subsequent manufacture of a uniform-heating tube. In this case, however, a satisfactory result was not obtained. Specifically, there is an extremely large difference in etching speed between silicon carbide and silicon, resulting in that the impregnated silicon alone was promptly etched away selectively in the etching steps for cleaning the wafer surface in the uniform-heating tube prior to the impurity diffusion and for cleaning the uniform-heating tube itself after the heat treatment. Naturally, it was impossible to prevent the impurities contained in the sintered silicon carbide from being diffused into the semiconductor device through the pin holes resulting from the selective silicon etching described above.

It is naturally of high importance to prevent the undesired impurities from being diffused from the uniform-heating tube and instruments used for producing a semiconductor device in order to improve the properties of the resultant semiconductor device.

An object of this invention is to provide a tube for effecting uniform heating (uniform-heating tube) and instruments capable of preventing undesired impurities from being diffused into the semiconductor device during the heating steps, etc.

Another object is to provide an apparatus for producing a semiconductor device high in reliability.

The other objects and advantages of the present invention will become apparent as the invention is more thoroughly discussed hereinafter.

An aparatus according to this invention for producing a semiconductor device comprises a core material and a silicon carbide layer coated thereon.

Figure 2:
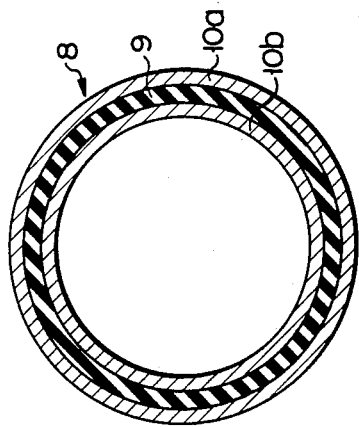
FIG. 2 shows a vertical cross section of a uniform-heating tube according to one embodiment of this invention.

A uniform-heating tube (or process tube) for the production of semiconductor devices is shown in FIG. 2. As depicted, the tube has a core material 9 with an outer layer of silicon carbide 10a and an inner layer 10b.

It is preferred that the silicon carbide layer be low in porosity and in impurity content. The porosity should preferably be less than 5%. Incidentally, it is possible to prepare a silicon carbide layer quite free from pores. Concerning the impurities, it is preferred that the silicon carbide layer be free from alkali metals and be less than 5000 ppm in iron content and less than 10 ppm in copper content. More preferably, the impurities contained in the silicon carbide layer should not exceed 80 ppm for Al, 50 ppm for Fe, 2 ppm for Mg, 5 ppm for Ca, 1 ppm for Cu, and 15 ppm for Ni.

Various materials can be used as the core material, including, for example, carbon, alumina, silicon, silicon nitride, silicon dioxide, silicon carbide and silicon carbide impregnated with silicon.

Figure 1:
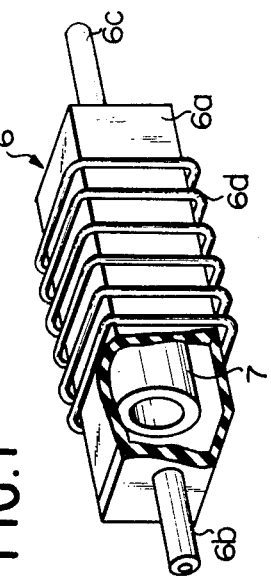
FIG. 1 is a perspective view, partly broken away, of a device for forming a silicon carbide coating layer on the surface of a core material.

The following description provides an example of producing a uniform-heating tube with silicon used as the core material. FIG. 1 shows an apparatus for coating a silicon carbide layer on the core material. As shown in the drawing, a reaction apparatus 6 comprises a furnace body 6a, a reactant gas inlet 6b, a waste gas outlet 6c and a high frequency (radio frequency) heating coil 6d wound round the furnace body 6a. A bare uniform-heating tube 7 made of silicon by a general method is disposed inside the reaction apparatus 6. With $N_2$ and $H_2$ used as the carrier gases, silicon tetrachloride ($SiCl_4$) and toluene ($C_7H_8$) are introduced into the furnace body 6a through the inlet 6b for heating with the high frequency heating coil 6d at, for example, 1200° C. to 1400° C. By this heating a silicon carbide layer is formed on the surface of the bare tube 7 as shown below:

$$7SiCl_4 + C_7H_8 + 10H_2 \rightarrow 7SiC + 28HCl$$

The silicon carbide layer formed by such a chemical vapor deposition method is low in porosity and in impurity content. In order to coat the core material perfectly and prevent the impurity diffusion from the core into the semiconductor device, the silicon carbide layer should preferably be at least 5μ thick. But, it may not be advantageous in terms of commercial merit to form the coating layer exceeding 1 mm in thickness. The most preferred thickness of the silicon carbide layer ranges from 80μ to 300μ.

FIG. 2 shows a cross section of a uniform-heating tube 8 prepared by the processes described above. It is seen that a silicon core material 9 is coated with silicon carbide layers 10a and 10b. Wafers or the like which are to be subjected to heat treatment are housed inside the tube 8. Since the silicon carbide surface layer exhibits a blocking effect against impurities, the wafer, etc. can be protected from contamination with impurities. Incidentally, the outer silicon carbide layer 10a of the uniform-heating tube 8 is not always required because it is not brought in contact with the atmosphere in which the wafer, etc. is disposed in the heating step. Accordingly, an insulation film of alumina, silicon nitride, silicon dioxide, zircon, etc. may be coated on the outer silicon carbide layer 10a. In the example described, the silicon carbide layer was formed by chemical vapor deposition, but other methods such as evaporation and sputtering may also be used for forming the silicon carbide layer.

Generally, the uniform-heating tube used in the heating step is etched with hydrogen chloride for its cleaning purpose. The use of hydrogen chloride is effective because the element chlorine acts as the getter of sodium ion contained in the tube. The etching is effected at about 1170° C. in the atmosphere of 2 to 3% by weight of hydrogen chloride with argon or oxygen used as the carrier gas. The etching rate of silicon under these conditions is 0.2 to 0.3 $\mu$/min. The value mentioned is reduced to 0.1 $\mu$/min or less if the hydrogen chloride content is set at 0.5% by weight with the other conditions unchanged. However, it has been found that the etching rate of the uniform-heating tube coated with a silicon carbide surface layer is as low as $5 \times 10^{-4} \mu$/min, in contrast to 0.2 to 0.3$\mu$/min mentioned above, where the etching is effected at about 1170° C. in the atmosphere of 2 to 3% by weight of hydrogen chloride with argon or oxygen used as the carrier gas. It is also important to note that silicon carbide is scarcely etched by the etching solution such as hydrofluoric acid-nitric acid which is generally used for the etching of silicon or the like. It follows that the apparatus for manufacturing a semiconductor device exhibits has prominent advantages including its prolonged life, etc.

Figure 3:
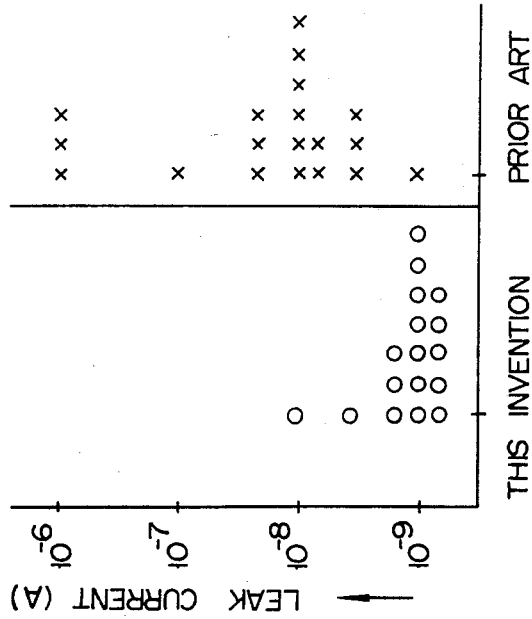
FIG. 3 shows leak currents of diodes produced by using an apparatus according to this invention and a conventional apparatus.

The uniform heating tube according to this invention scarcely liberates impurities in the heating step, permitting the resultant semiconductor device to exhibit marked improvements in reliability. The comparative tests between this invention and the prior art were conducted for leak current. Specifically, a number of diodes were produced by a general method using both a uniform-heating tube according to this invention and a conventional tube made of alumina. The diodes thus produced, which were of the same construction, were subjected to leak current measurements with the results as shown in FIG. 3. The circles (O) and crosses (X) shown in FIG. 3 denote respectively the diodes for the case of this invention and the prior art. The number of these marks represents the number of diodes. For example, it is shown that only one diode exhibited about $10^{-8}$A of leak current for the case of this invention, whereas six diodes exhibited about $10^{-8}$A of leak current from the prior art case. FIG. 3 demonstrates that the diodes produced by using the uniform-heating tube according to this invention are very uniform in leak current in contrast to the diodes for the prior art case which exhibited leak currents ranging from $10^{-6}$ to $10^{-9}$A. It is also seen that the leak current for this invention is markedly smaller as a whole than that for the prior art.

Additional tests were conducted to look into the noise characteristic of the diode produced by using an apparatus according to this invention in comparison with that of the conventional diode. Specifically, the noise characteristic, i.e., the product of 1/f noise and pulse noise, of diodes of the same construction produced by using the apparatus shown in Table 1 below was measured, with the results as shown in Table 1.

TABLE 1

| Apparatus used for Diode Production | Noise Yield (%) |
|---|---|
| Uniform-heating tube made of alumina and wafer boat made of quartz | 80 |
| Uniform-heating tube made of SiC impregnated with Si* and wafer boat made of quartz | 95 |
| Uniform-heating tube made of SiC coated with SiC layer and wafer boat made of quartz | 98 |
| Uniform-heating tube made of SiC coated with SiC layer and wafer boat made of Sic coated with SiC layer | 98 to 100 |

*The Si impregnated into the tube was gradually etched away in the course of repeated uses of the tube resulting in gradual decrease of the noise yield of the diode produced by using the tube.

Clearly, the uniform-heating tube or instrument coated with a silicon carbide layer according to this invention is very much effective for protecting the semiconductor device from contamination with impurities such as sodium ion in the heating step.

What we claim is:

1. A process tube for fabricating a semiconductor device, said tube comprising a core of material selected from the group consisting of: sintered silicon carbide and silicon-impregnated sintered silicon carbide, at least the inner surface of said core having a layer of non-porous silicon carbide deposited thereon.

2. The process tube according to claim 1, wherein the silicon carbide layer is formed by chemical vapor deposition.

3. The process tube of claim 1, wherein the silicon carbide layer is $5\mu$ to $1\mu$ thick.

4. The process tube of claim 1, wherein the silicon carbide layer is $80\mu$ to $300\mu$ thick.

5. The process tube of claim 1, wherein the tube has the entire inner and outer surfaces coated with the silicon carbide layer.

6. The process tube of claim 5, wherein an insulation film is coated on the silicon carbide layer of the outer tube surface.

7. The process tube of claim 6, wherein the insulation film is formed of a material selected from the group consisting of alumina, silicon nitride, silicon dioxide and zircon.

8. In a process tube for fabricating semiconductor devices, the improvement comprising: a central core for said tube wherein said core is a material selected from the group consisting of: sintered silicon carbide and silicon-impregnated sintered silicon carbide, said tube further including means for reducing the passage of impurities from the exterior of said tube through said core, said reducing means comprising a layer of nonporous silicon carbide deposited on at least the inner surface of said tube.

9. The process tube of claim 8 wherein said layer is deposited by chemical vapor deposition.

10. The process tube of claim 9 wherein said layer is $5\mu$ to $1\mu$ thick.

11. The process tube of claim 9 wherein said layer is $80\mu$ to $300\mu$ thick.

* * * * *